United States Patent
Ma (10) Patent No.: US 6,192,263 B1
(45) Date of Patent: Feb. 20, 2001

(54) PHASE-SENSITIVE INVERSION RECOVERY METHOD OF MR IMAGING

(75) Inventor: Jingfei Ma, Waukesha, WI (US)

(73) Assignee: General Electric Company, Milwaukee, WI (US)

( * ) Notice: Under 35 U.S.C. 154(b), the term of this patent shall be extended for 0 days.

(21) Appl. No.: 09/145,092

(22) Filed: Sep. 1, 1998

(51) Int. Cl.$^7$ ................................................ A61B 5/055
(52) U.S. Cl. ........................ 600/410; 324/309; 382/128
(58) Field of Search ............................ 600/410; 324/307, 324/309; 382/128, 298, 299

(56) References Cited

U.S. PATENT DOCUMENTS

| | | | |
|---|---|---|---|
| 4,777,620 | * 10/1988 | Shimoni et al. | 364/900 |
| 4,908,578 | * 3/1990 | Van Liere | 324/309 |
| 5,596,659 | * 1/1997 | Normile et al. | 382/253 |
| 5,621,321 | * 4/1997 | Liu et al. | 324/309 |
| 5,864,233 | * 1/1999 | Zhou et al. | 324/309 |
| 5,896,463 | * 4/1999 | Kuhn | 382/133 |
| 5,929,637 | * 7/1999 | Taguchi et al. | 324/306 |
| 5,933,540 | * 8/1999 | Lakshminarayanan et al. | 382/260 |
| 5,943,433 | * 8/1999 | Avinash | 382/131 |
| 6,016,057 | * 1/2000 | Ma | 324/309 |

OTHER PUBLICATIONS

Inversion Recov. Image Reconstruct. with Multiseed Region–Growing Spin Reversal, Qing–San Xiang, JMRI, Sep./Oct. 1996, pp. 775–782.

* cited by examiner

Primary Examiner—Marvin M. Lateef
Assistant Examiner—Shawna J Shaw
(74) Attorney, Agent, or Firm—James O. Skarsten; Christian G. Cabou; Phyllis Y. Price (57) ABSTRACT

A phase-sensitive method of inversion recovery MR imaging is provided, which is directed to a specified object. The method comprises the steps of applying an inversion-recovery MR sequence to the object to acquire a set of MR data for an initial image, wherein the initial image comprises a pixel matrix of specified size, each of the initial image pixels having an associated MR signal and a phase vector. The method further comprises generating a phase vector image from information provided by respective initial image pixels, the phase vector image having a matrix size which is substantially less than the matrix size of the initial image. A region-growing procedure is applied to the phase vector image to remove phase errors therefrom. Thereupon, the phase vector image is zoomed or expanded to a matrix of the same size as the initial image matrix. For multi-slice imaging where TI time is comparatively long, the method may employ a distributed interleave mode of data acquisition to reduce total imaging time. In such arrangement, the inversion pulse for a particular slice is placed in between the imaging pulses for two other slices. Moreover, in the method of the invention the image intensity in the phase-sensitive inversion recovery is made proportional to the physical magnetization. Accordingly, tissues with a full range of T1's, rather than just one specific T1, can be effectively suppressed by choosing an appropriate inversion time, and by applying a simple thresholding to the phase-sensitive IR images.

19 Claims, 6 Drawing Sheets

(1) DIRECT AVERAGING OF 4 X 4 PIXEL (2) AVERAGING AFTER INVERSION OF NEGATIVE IMAGINARY COMPONENTS OF 4 X 4 PIXELS (3) AVERAGING AFTER INVERSION OF NEGATIVE REAL COMPONENTS OF 4 X 4 PIXELS (4) HYBRID PHASE VECTOR IMAGE

FIGURE 5A

FROM FIG. 5A

FROM FIG. 5A

92 — CHOOSE OVERALL SIGN AFTER EACH GROWTH BY REQUIRING THAT THE TOTAL MAGNETIZATION IS EITHER POSITIVE OR NEGATIVE DEPENDING ON TI CHOSEN

96 — ZOOM PHASE VECTOR IMAGE UP TO SIZE OF ORIGINAL IMAGE (256 × 256)

98 — APPLY LOW-PASS FILTER TO PHASE VECTOR IMAGE

FROM FIG. 5A

100 — USE PHASE VECTOR IMAGE TO CORRECT ORIGINAL IMAGE AND THEREBY PROVIDE PHASE-SENSITIVE IR IMAGE

PHASE-SENSITIVE INVERSION RECOVERY METHOD OF MR IMAGING

BACKGROUND OF THE INVENTION

The invention disclosed and claimed herein generally pertains to an improved inversion recovery (IR) method of magnetic resonance (MR) imaging. More particularly, the invention pertains to a method of the above type which retains the intrinsic phase information from the originally acquired data in reconstructing an image. Even more particularly, the invention pertains to a method of the above type which preserves the directional information of the magnetization vectors, while effectively reducing noise and artifacts.

As is well known by those skilled in the art, an inversion recovery-prepared MR pulse sequence includes a 180° RF inversion pulse, followed by a 90° RF excitation pulse after an inversion recovery time (TI). It has long been recognized that such sequences offer potentially superior T1-contrast because the range of the longitudinal magnetization is doubled by the 180° inversion pulse. However, the most successful application of the IR sequences so far is still restricted to suppression of species with certain T1. The comparatively rare use of the IR sequence for T1-contrast enhancement is mainly due to two significant disadvantages. First, IR sequence time is usually significantly longer than other imaging sequences because of the long inversion recovery time, and the total imaging time may become prohibitive for multi-slice imaging. Secondly, IR images acquired at certain inversion times may display a reversed contrast, so that tissues of longer T1's appear brighter than tissues of shorter T1's. This anomalous phenomenon is known to originate from the widely-used magnitude reconstruction on commercial MRI scanners, and has been reported to cause confusion and difficulty in image interpretation.

The 2D Fourier Transform of the time-domain data acquired in a spin echo or fast spin echo inversion recovery sequence can be, in general, expressed as:

$$S(x,y) = I(x,y) e^{j(\phi_i(x,y) + \phi_e(x,y))} \qquad \text{Eqn. (1)}$$

In Equation (1), $\phi_i(x,y)$ is the intrinsic phase, determined by the sign of the spin magenetization at the time of the excitation. $\phi_i(x,y)$ can therefore only take a value of either 0 or $\pi$. $\phi_e(x,y)$ is a ubiquitous phase error term, which is independent of time, but generally varies with spatial locations. Possible sources of contribution to $\phi_e(x,y)$ include complex passband RF receiver filters, mis-centering of the data acquisition windows, poor gradient compensation, $B_o$-field inhomogeneity, and phase shifts due to RF receiver coils In a conventional reconstruction, however, only magnitude is typically used. As a result, both the intrinsic phase $\phi_i(x,y)$ and the phase error term $\phi_e(x,y)$ have, in the past, generally been discarded. I(x,y) is the magnitude of the image vector, as obtained in a conventional magnitude reconstruction. I(x,y) is generally a function of the initial magnetization $M_o(x,y)$, as well as some imaging and tissue parameters, and can be expressed as follows:

$$I(x,y) = |M_o(x,y)[1 - 2e^{(-TI/T1)} - e^{(-TR/T1)} + 2e^{((-TR-TE/2)/T1)}]| \qquad \text{Eqn. (2)}$$

SUMMARY OF THE INVENTION

In accordance with the invention, a method of phase-sensitive IR image reconstruction is provided to restore the intrinsic phase factor $e^{j\phi_i}$, which is lost along with the unwanted phase error term in conventional MR imaging using only magnitide reconstruction. From Equation (1), it is seen that three unknowns are involved, i.e., I(x,y), $\phi_i(x,y)$, and $\phi_e(x,y)$. However, it has been recognized that $\phi_e(x,y)$ is generally a slow-varying function, and $\phi_i(x,y)$, has a binary value of either 0 or $\pi$. Accordingly, a technique has been developed to determine all three of the unknown parameters with a single data acquisition.

The method of the invention includes the step of applying an inversion-recovely MR sequence to an object of imaging, to acquire a set of MR data for an initial image comprising a pixel matrix of specified size, such as a 256×256 matrix. Each of the pixels has an associated MR signal and a phase vector. The method further includes generating a phase vector image from information provided by the pixels of the initial image, the phase vector image being substantially smaller than the initial image, such as of a 64×64 matrix size. A region-growing procedure is applied to the phase vector image to remove phase errors therefrom. The phase vector image is then zoomed or expanded to a matrix of the specified size.

In a preferred embodiment of the invention, the phase vector image is generated by constructing first and second intermediate images, comprising matrices of first and second pixels respectively. Each of the pixels from the first image has a signal strength derived by selectively averaging the signals of a corresponding group of initial image pixels, after inverting any phase vectors thereof having a negative real component. In like manner, each of the pixels from the second image has a signal strength derived by selectively averaging the signals of a corresponding group of initial image pixels, after inverting any phase vectors thereof having a negative imaginary component. Thereafter, the first and second intermediate images are selectively processed to form the phase vector image. Preferably, such processing step comprises comparing corresponding pixels of the first and second intermediate images, and selecting the compared pixel which is of greater amplitude as a pixel for the phase vector image.

In view of the above, important purposes of the invention are to provide a method of inversion recovery MR imaging which restores the intrinsic contrast range, and also eliminates the contrast reversal phenomenon; which retains or restores the intrinsic phase factor, that is, the intrinsic phase information of originally acquired data, and separates such information from unwanted phase error; which optimizes imaging time and wherein all necessary data may be obtained in a single data acquisition; and which improves reliability and requires no manual or user intervention. Other purposes and advantages of the invention will become more readily apparent from the following description, taken together with the accompanying drawings.

DETAILED DESCRIPTION OF THE PREFERRED EMBODIMENT

Figure 1:
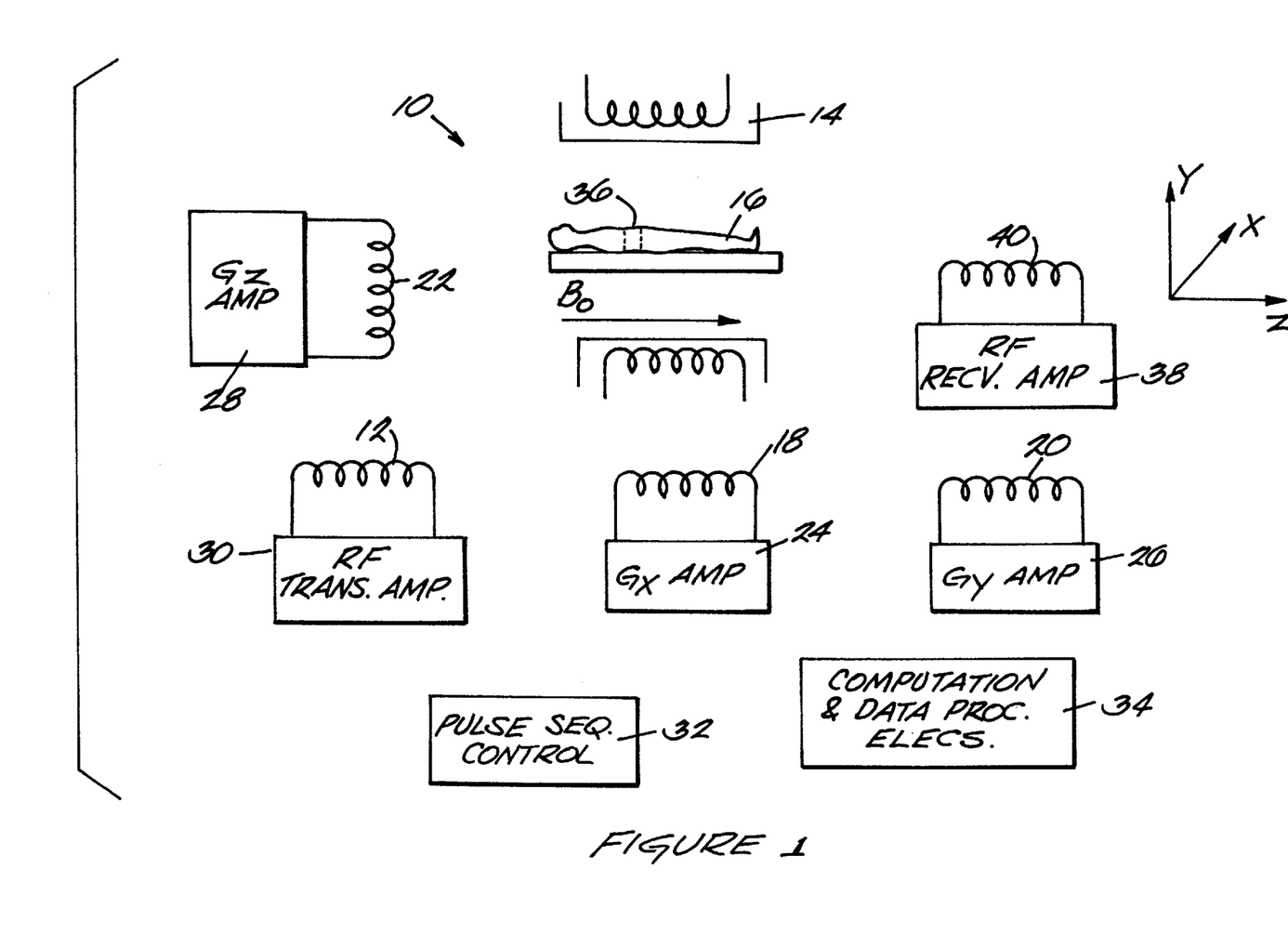
FIG. 1 is a schematic diagram showing basic components of an MR system for use in practicing an embodiment of the invention.

Referring to FIG. 1, there are shown the basic components of an MR system 10 which may be operated to acquire MR data, as described herein. System 10 includes an RF transmit coil 12, as well as a magnet 14 for generating a main or static magnetic field $B_o$ in the bore of a cylindrical magnet. RF coil 12 is operated to transmit RF excitation signals into a region 36 of patient or other imaging subject 16 residing in the magnet bore, in order to produce MR signals. System 10 further includes gradient coils 18, 20 and 22 for generating $G_x$, $G_y$, and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30.

Referring further to FIG. 1, there is shown system 10 provided with an RF coil 40, which is operated in association with a receive amplifier 38 to acquire MR signals from the region 36 of patient 16. System 10 is further provided with a pulse sequence control 32, which is operated to control the RF and gradient amplifiers, and to thereby generate pulse sequences to produce and acquire sets of MR signals. System 10 also includes computation and processing electronics 34, which may be readily operated to process acquired data in accordance with the invention. The construction, functions, and interrelationships of the respective components of MR system 10 are well known and described in the prior art, such as in U.S. Pat. No. 5,672,969, issued Sep. 30, 1997 to Zhou et al.

In a useful embodiment of the invention, MR system 10 is operated in accordance with a conventional inversion-recovery MR pulse sequence to acquire data, such as from region 36 of subject 16 or the like. System 10 is further operated to Fast Fourier Transform (FFT) the acquired data, and otherwise process it to provide an initial or original MR image. Usually, the initial image comprises a 256×256 matrix array of pixels. As previously described, an IR image has an associated intrinsic phase $\phi_i(x,y)$.

Figure 2:
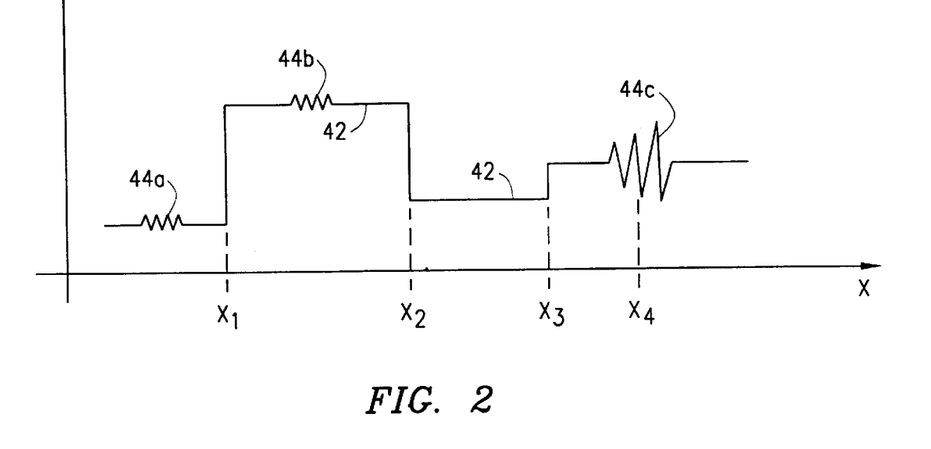
FIG. 2 is a graphic diagram illustrating a problem to which the invention is directed.

Referring to FIG. 2, there is shown a curve 42 comprising a plot of intrinsic phase $\phi_i(x,y)$, with respect to a spatial dimension such as the X-axis. As stated above, intrinsic phase $\phi_i$ can have only the values 0 and π, indicating reversal or inversion of intrinsic phase, such as at $x_1$, $x_2$ and $x_3$. However, as indicated by Eqn. (1), the total phase is actually the sum of intrinsic phase is and an external phase term $\phi_e(x,y)$. External phase is represented in FIG. 2 by phase components 44a, 44b and 44c superimposed on intrinsic phase curve 42. External phase components 44a and 44b are small, compared with magnitudes associated with intrinsic phase. Accordingly, such components are not likely to be mistaken for intrinsic phase inversions. However, external phase component 44c shows a signal strength which is significantly large, compared with intrinsic phase, and could thereby be interpreted to indicate one or more intrinsic phase inversions, such as at $x_4$.

In accordance with the invention, it has been recognized that by increasing the signal-to-noise ratio (SNR) of the acquired data, the strength of MR signal associated with intrinsic phase is significantly increased, with respect to external phase errors. Accordingly, it becomes much easier to distinguish between intrinsic phase information, useful for constructing an IR image, and distorting external phase terms $\phi_e(x,y)$. Moreover, it has been recognized that SNR can be increased by reducing the matrix size of the original or initially acquired image, whereby resolution is also reduced, but pixel size is increased. Thus, the 256×256 initial image is reduced to a smaller size image matrix, such as a 64×64 image. Such reduction is generally carried out by computing the signal value of each pixel of the 64×64 image from respective signal values of a corresponding 4×4 pixel array, taken from the initial image. Each pixel of the reduced image matrix has an associated phase vector, determined by the magnetization distribution of its corresponding 4×4 pixel array.

Figure 3:
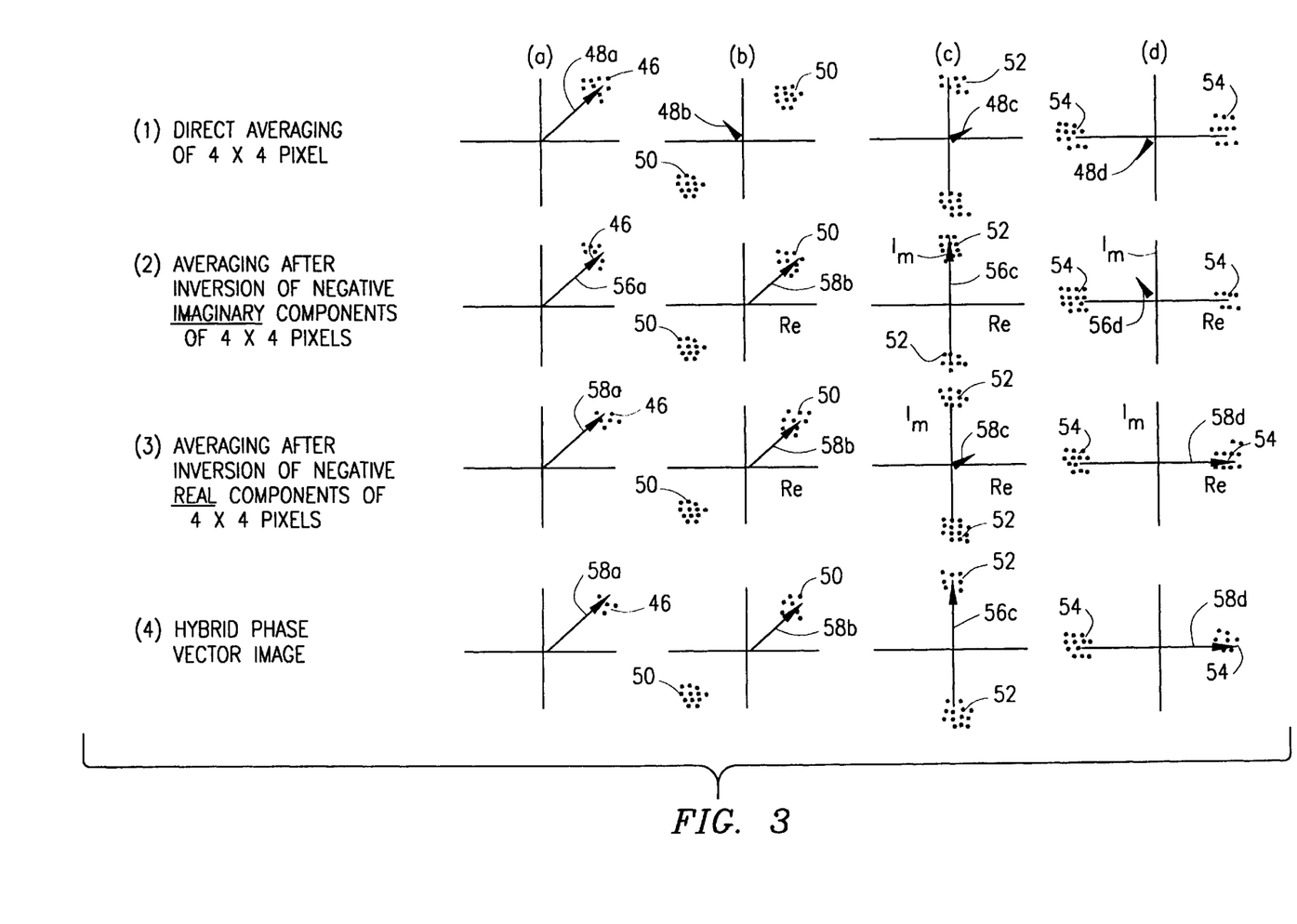
FIG. 3 is a graphic diagram depicting construction of a phase vector image for an embodiment of the invention.

Referring to FIG. 3, there are shown phase vectors which are respectively produced by different possible magnetization distributions in corresponding 4×4 pixel regions. There are further shown different approaches for computing the phase vector for a pixel of the reduced 64×64 image. More particularly, each of the columns (a)–(d) of FIG. 3 shows a different magnetization distribution, and each of the rows (1)–(4) shows a different phase vector computational technique, as described hereinafter in further detail.

Row (1) of FIG. 3 is directed to a procedure wherein the MR signal of a pixel of the 64×64 image is computed directly, by complex averaging of the signal values of its corresponding 4×4 array pixels. This works quite well where each of the pixels of the 4×4 array have the same intrinsic phase $\phi_i(x,y)$. This is the situation, for example, for magnetization distribution 46 of column (a), wherein the signals of respective array pixels have only positive real and imaginary components. For such situation, direct averaging of the 4×4 pixels produces a phase vector 48a, which accurately preserves phase information from the original image. However, columns (b)–(d) respectively depict magnetization distributions 50–54. Each of these distributions derives from a 4×4 pixel region which contains a group of pixels of a particular intrinsic phase, but also contains another group of pixels of the opposite intrinsic phase. Such situation occurs in IR imaging at the boundary regions of two tissues of different T1's. When the averaging technique of row (1) is applied to such pixel regions, intrinsic phase effects substantially cancel, resulting in negligible phase vectors such as 48b–48d. Thus, such direct averaging technique results in uncertain or lost phase information, when applied to 4×4 pixel regions containing pixels of opposing phase.

Referring to row (2) of FIG. 3, there is shown a technique for retaining the phase information of magnetization distributions 50 and 52, of columns (b) and (c), respectively. For such distributions, the 4×4 regions include pixels which have opposing imaginary components. In accordance with the technique of row (2), all negative imaginary components of pixels of the 4×4 region are first inverted. Complex averaging is then applied to the resulting array, to provide phase vectors for the corresponding 64×64 reduced image. Such technique produces phase vectors 56b and 56c, which preserve the phase information of the pixel arrays associated with columns (b) and (c), respectively. However, magnetization distribution 54, and the phase vectors associated therewith, are clustered about the real axis. Accordingly, phase information provided by phase vector 56d, generated by the procedure of row (2), may be uncertain.

To compensate for such shortcoming, row (3) of FIG. 3 illustrates a technique which is very similar to the technique of row (2), except that negative real components of a 4×4 pixel array, rather than imaginary components, are inverted before complex averaging takes place. The technique of row (3) provides phase vectors 58a, 58b and 58d, which retain the intrinsic phase information of magnetization distributions 46, 50 and 54, respectively. Phase vector 58c does not retain phase information of distribution 52, which is clustered about the imaginary axis.

It will be readily apparent that if two 64×64 matrix images are formed from the initial image, one following the procedure of row (2) of FIG. 3 and the other following the procedure of row (3), the two images together will substantially contain all the phase information of the 256× 256 original image. Accordingly, as an intermediate step, two such 64×64 images are formed. They are then used to construct a 64×64 hybrid phase vector image, as shown by row (4) of FIG. 3. More particularly, corresponding pixel values of the two intermediate images are compared, and the pixels with values of greater amplitude are selected for the corresponding pixel of the hybrid image. Thus, row (4) of FIG. 3 shows phase vector 56c selected to represent phase effects of magnetization distribution 52, and phase vector 58d selected to represent phase effects of distribution 54.

As stated above, intrinsic phase $\phi_i(x, y)$ in an IR image has only a binary value, of either 0 or $\pi$, and external phase error tends to be a slowly-varying function. Accordingly, the direction of a given image pixel, as represented by Eqn. (1), and the direction of the phase vector of a neighboring or adjacent pixel, should be constrained to lie either within a small angular range in their vicinity, or within a small angular range in the opposite direction, depending on the T1 times of tissue in the two pixels. Based on this, as a further step for an embodiment of the invention, a 2D region-growing process is applied to the 64×64 hybrid phase vector image, constructed as described above in connection with FIG. 3. The region-growing process tends to identify and separate external phase errors $\phi_e(x,y)$ from intrinsic phase $\phi_i(x,y)$, and also ensures smooth region growth, i.e., smooth transition between adjacent pixels.

Figure 4:
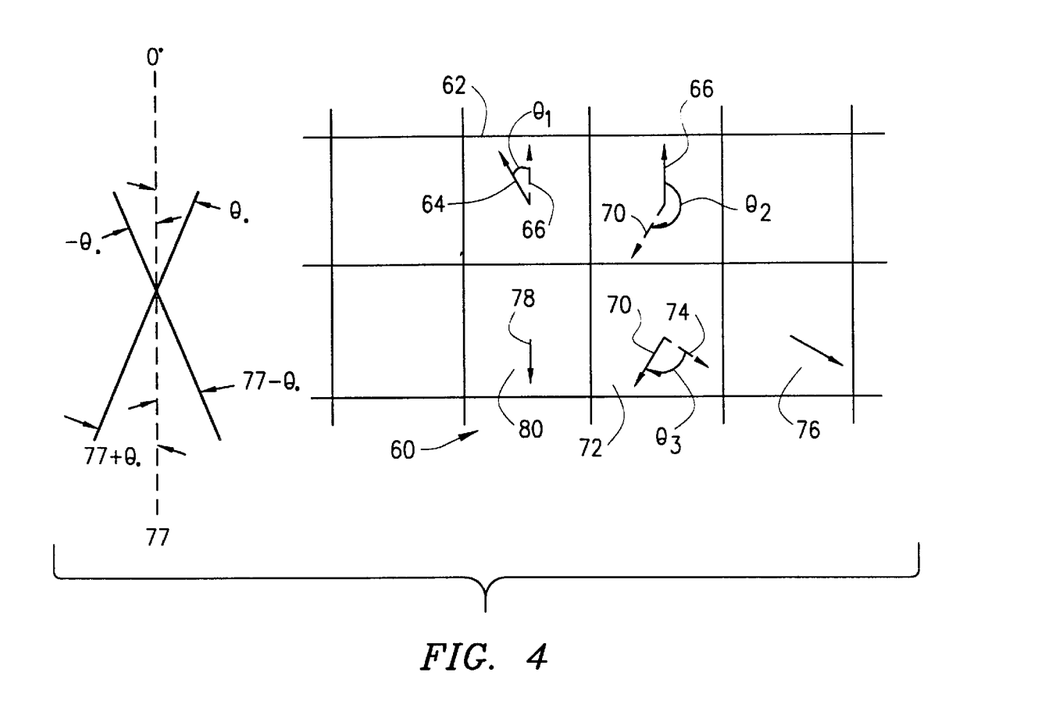
FIG. 4 is a schematic diagram pertaining to a region growing process for an embodiment of the invention.

Referring to FIG. 4, there is shown a portion 60 of a 64×64 hybrid phase vector image, as described above. In accordance with the region-growing process, one of the pixels of phase vector image 60, such as pixel 62, is initially selected at random to be a "seed" pixel. A determination is made of $\theta_1$, the angle between the phase vector 64 of pixel 62 and phase vector 66 of a neighboring pixel 68. $\theta_1$ is then compared with each of two angular ranges, $0°\pm\theta_0$ and $\pi\pm\theta_0$, to determine whether the value of $\theta_1$ falls within either range. $\theta_0$ is selected to be comparatively small, e.g., on the order of 15°–25°. FIG. 4 shows phase vector 66 of pixel 68 to have a direction such that $\theta_1$ lies within the range $0°\pm\theta_0$. This indicates a smooth minimal external phase error and a smooth transition between neighboring pixels 62 and 68. Accordingly, pixel 68 is selected as the seed pixel, to determine the angle between its phase vector 66 and the phase vectors of one or more neighboring pixels to which the region-growing procedure has not yet been applied.

Referring further to FIG. 4, there is shown the angle $\theta_2$ between phase vector 66 of new seed pixel 68 and phase vector 70 of pixel 72 adjacent thereto. $\theta_2$ is found to lie within the angular range $\pi\pm\theta_0$. Accordingly, pixel 72 is now selected as the seed pixel. However, it is also recognized that the intrinsic phase of pixel 72 has been inverted with respect to intrinsic phase of pixel 68.

FIG. 4 further shows $\theta_3$ as the angle between phase vector 70 of pixel 72 and phase vector 74 of neighboring pixel 76. $\theta_3$ is found to lie outside both the angular ranges $0°\pm\theta_0$ and $\pi\pm\theta_0$. Accordingly, pixel 76 does not become the seed pixel. Instead, pixel 72 continues to be used as the seed pixel, and the direction of phase vector 70 thereof is compared with phase vector 78, as described above, of another neighboring pixel 80, to determine whether pixel 72 or 80 should thereafter be used as the seed pixel.

In the region-growing process described above, if the angular difference between the directions of the vector for the seed pixel and that for the pixel being compared therewith is within the angular threshold $0°\pm\theta_0$, $e^{j\Phi}_i(x, y)$ for the compared pixel would not change in value, and $e^{j\Phi}_e(x,y)$ would keep its value as set forth in Equation (1), above. Otherwise, if the angular difference is within $\pi\pm\theta_0$, both $e^{j\Phi}_i(x,y)$ and $e^{j\Phi}_e(x,y)$ would change their sign. The value of $\theta_0$ is, in theory, dependent on the extent of the spatial variations of the phase errors. However, in practice a value for $\theta_0$ between 15° and 25°, as stated above, seems to insure a smooth region-growth without unnecessary disruptions. The exact value of $\theta_0$ used is not critical as long as its much smaller than 90° (so that no artificial flip is generated) and is above the noise level (so that the region growing can proceed smoothly).

Figure 5A:
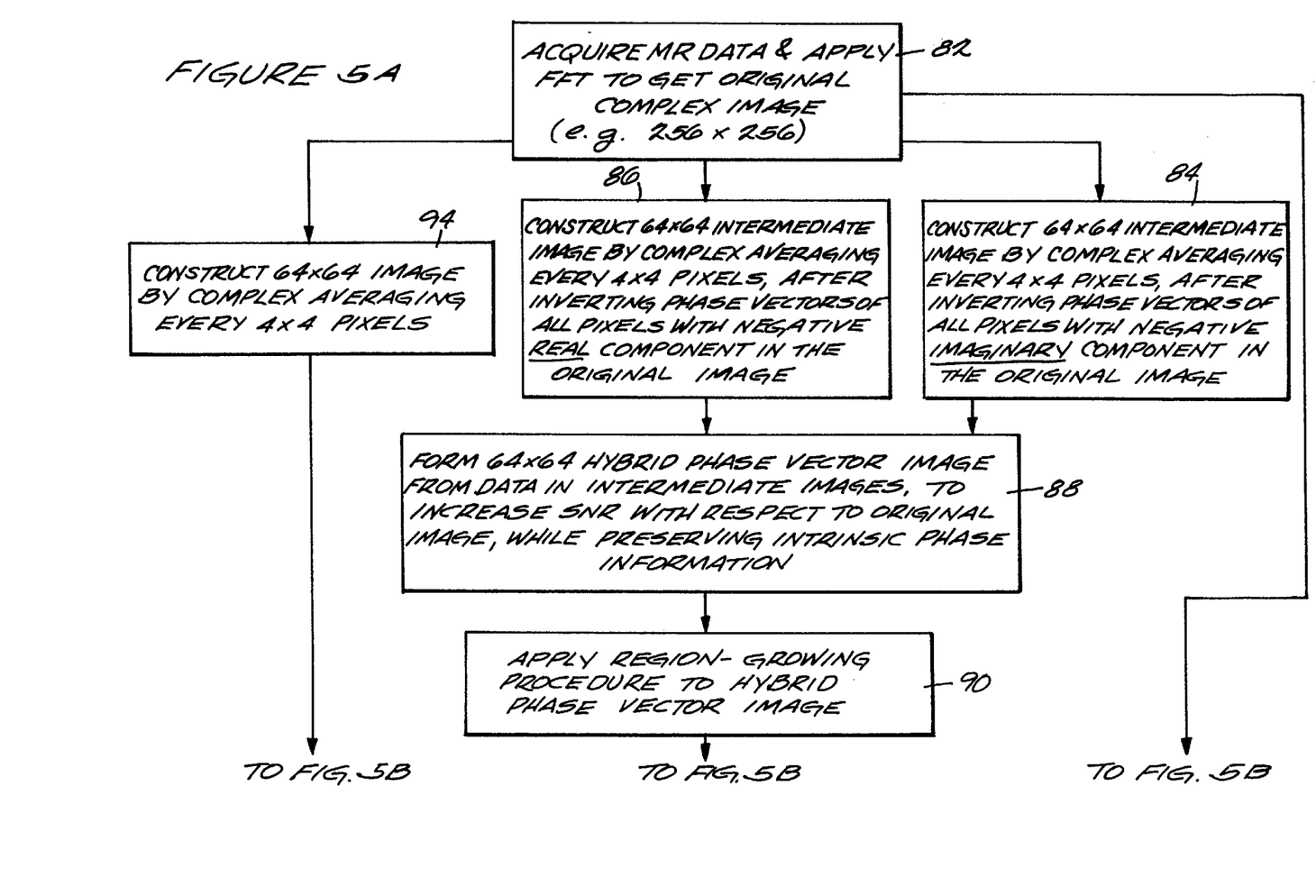
FIGS. 5A and B are a flow chart showing respective steps of a method comprising an embodiment of the invention.
Figure 5B:
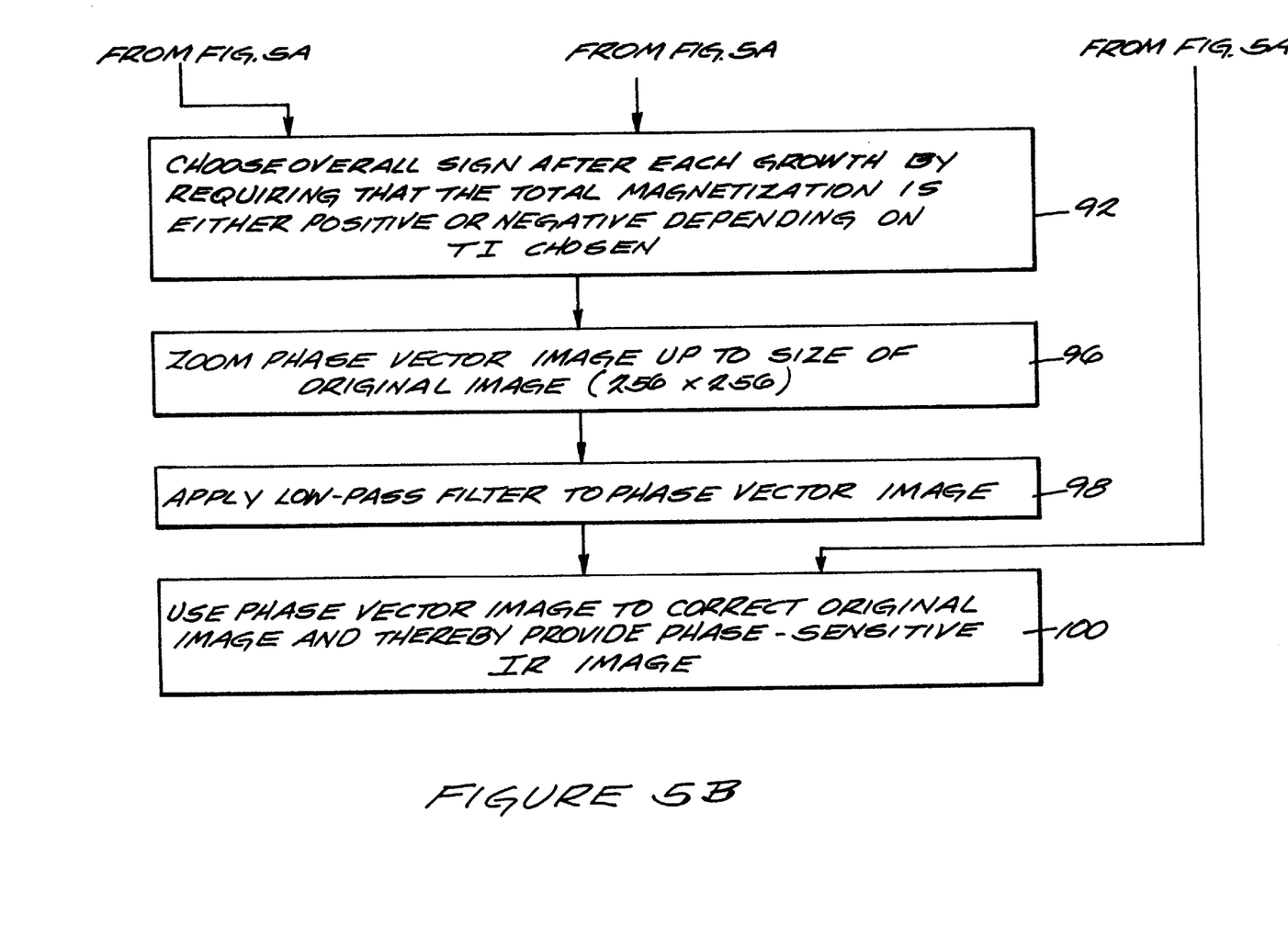

Referring to FIG. 5, there is shown a flow chart which generally summarizes the steps for an embodiment of the invention. Initially, a set of MR data is acquired by means of an IR sequence, to provide an image of specified matrix size, such as 256×256, as described by process block 82. The data of the initial image is then employed to construct two 64×64 intermediate images. These procedures are set forth in process blocks 84 and 86 of FIG. 5, and are described above in connection with rows (2) and (3), respectively, of FIG. 3. Data from the two intermediate images is employed to form a 64×64 hybrid phase vector image, as shown by process block 88 of FIG. 5, and as likewise described above, in connection with row (4) of FIG. 3. The phase vector image, in being reduced to a matrix size of 64×64, has substantially greater SNR than the original 256×256 image. At the same time, the phase vector image of process block 88 preserves the intrinsic phase information of the original image.

Referring further to FIG. 5, process block 90 shows the region-growing procedure, described above in connection with FIG. 4, applied to the hybrid phase vector image. The region-growing procedure determines and separates external phase error $\phi_e(x,y)$ from intrinsic phase $\phi_i(x,y)$ for respective pixels, and ensures smooth angular continuity between adjacent pixels.

To determine the overall sign after region-growth, process block 92 requires that total magnetization be either positive or negative, depending on the selected TI. This step is necessary to ensure that the phase vector image will show the right contrast. That is, it is essential to be sure that light and dark areas of the image do not inadvertently become reversed, as the result of an unintended inversion of respective phase vectors of the phase vector image. Such step is carried out in part by means of process block 94. In accordance therewith, a 64×64 image is constructed, simply by averaging respective 4×4 pixel arrays of the original 256×256 image, as described above in connection with row (1) of FIG. 3. Information provided by such image is then used in accordance with process block 92, to determine whether the phase vectors of respective pixels of the phase vector image should be inverted or should be left alone, to ensure correct contrast.

After completion of the procedure of process block 92, the phase vector image is expanded or zoomed to the size of the original image matrix, i.e., 256×256, as indicated by process block 96. A low-pass filter operation is then applied to the expanded image, as specified by process block 98. At this stage, external phase errors $e^{j\Phi}_e(x,y)$ are determined by requiring smooth spatial angular continuity for any pixels that are not visited during the region-growing procedure. The final output, that is an IR image that is sensitive to phase, is produced by taking the real part of the original image, after it is multiplied with the complex conjugate of the filtered phase vector image. This procedure is indicated by process block 100. It is to be noted that the entire data processing method, as set forth in FIG. 5, is fully automatic and needs no manual intervention.

As stated above, one of the disadvantages of the conventional IR sequence has been the substantial length of total imaging time, which can become prohibitive for multi-slice imaging. In the conventional IR sequence, both inversion and imaging pulses for a given slice are played together, or generated, before playing the pulses for another slice. When TI is long, a considerable amount of time may be wasted during the TI time.

Figure 6:
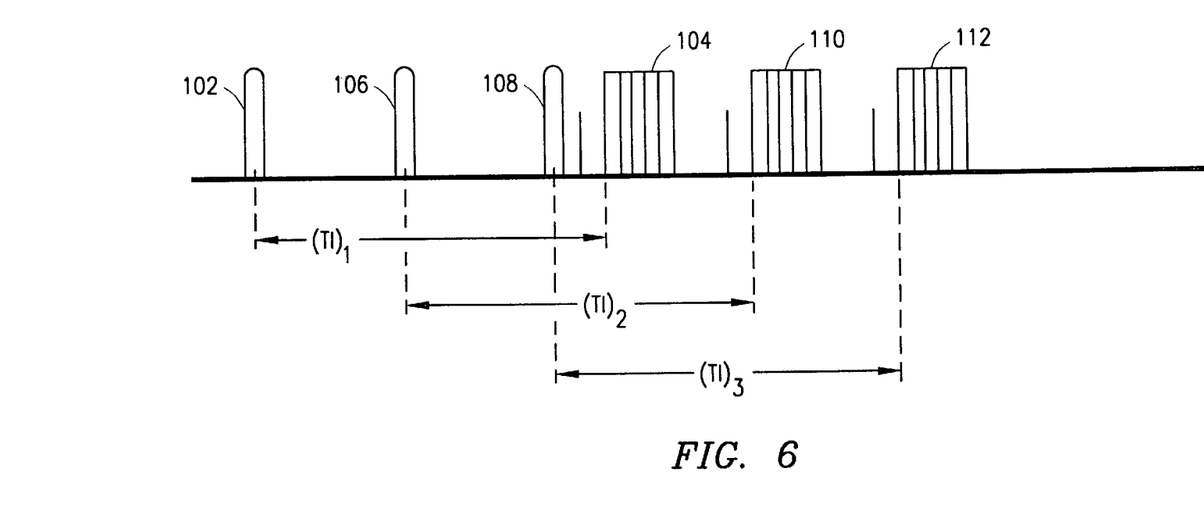
FIGS. 6–7 are graphic diagrams showing respective interleave modes for multi-slice IR imaging, for use in connection with an embodiment of the invention.

Referring to FIG. 6, there is shown an interleave mode for IR imaging which makes use of the long TI time. Such acquisition mode may be referred to as "distributed interleave", and is more time-efficient than the conventional IR sequence. FIG. 6 shows an inversion pulse 102, associated with imaging of a first slice (Slice No. 1), which is followed after an inversion time $(TI)_1$ by first slice acquisition pulses 104. During the inversion time $(TI)_1$, the inversion pulses 106 and 108 are generated, which are associated with Slice No. 2 and Slice No. 3, respectively. Imaging acquisition pulses 110 for Slice No. 2 occur after time $(TI)_2$ following inversion pulse 106, and imaging acquisition pulses 112 occur after time $(TI)_3$ following inversion pulse 108.

Figure 7:
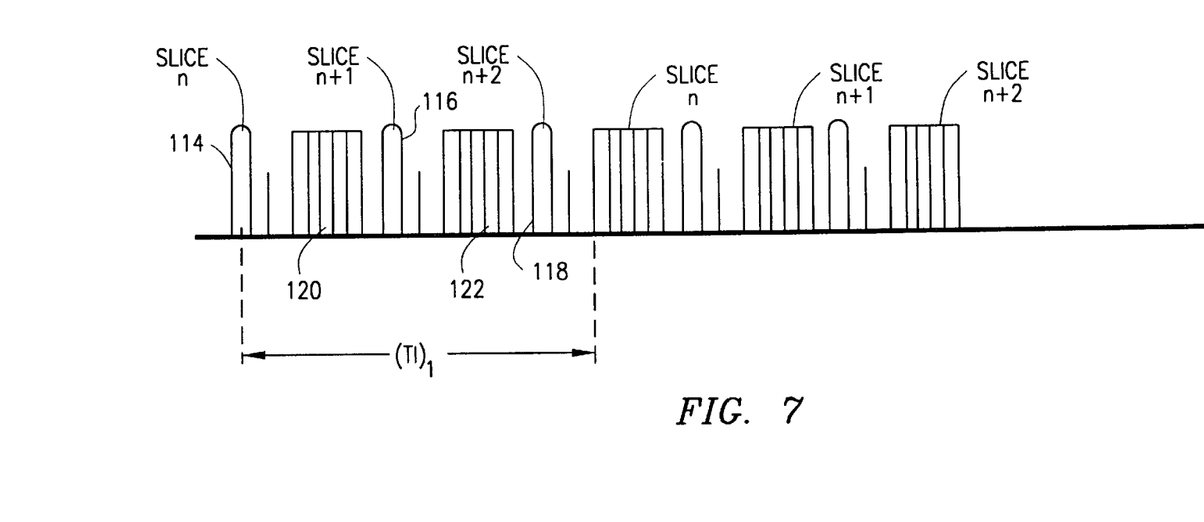

In the acquisition mode of FIG. 6, the time interval between the inversion pulses of two different slices is not used. For situations where this time is long, such as in a fast spin echo scan, a modified interleave acquisition may be employed, which is shown in FIG. 7 and is referred to as "distributed interleave". In such arrangement, the inversion pulse for a particular slice is placed in between the imaging pulses for two other slices. Thus, FIG. 7 shows inversion pulse 114, associated with a slice n, followed by an inversion time $(TI)_1$. During $(TI)_1$ inversion pulses 116 and 118 are generated, in connection with slices n+1 and n+2, respectively. FIG. 7 further shows image acquisition pulses 120 also occurring during inversion time $(TI)_1$, interleaved between inversion pulses 114 and 116, and image acquisition pulses 122 are shown to occur between inversion pulses 116 and 118. Image acquisition pulses 120 and 122 are associated with slices n−2 and n−1, respectively, and with inversion pulses (not shown) occurring prior to inversion pulse 114.

In the method described above, the image intensity in the phase-sensitive inversion recovery is made proportional to the physical magnetization (no non-linear operation is involved). Thus, it can be seen that tissues with a full range of T1's, rather than just one specific T1, can be effectively suppressed by choosing an appropriate inversion time TI, and by a simple thresholding applied to the phase-sensitive IR images. That is, any tissue having a T1 which is less than a threshold value, or alternatively is greater than the threshold value, wherein the threshold value is determined by selection of TI, will have a magnetization of specified polarity (such as negative). All tissue in such T1 range may then be readily suppressed, or left out, in image construction.

Other modifications and variations of the present invention are possible in light of the above teachings. It is therefore to be understood that within the scope of the disclosed concept, the invention may be practiced otherwise than as specifically described.

What is claimed is:

1. A phase-sensitive method of MR imaging directed to a specified object, said method comprising the steps of:

applying an inversion-recovery MR sequence to said object to acquire a set of MR data for an initial image comprising a pixel matrix of specified size, each of said initial image pixels having an associated MR signal and a phase vector;

generating a phase vector image, from information provided by said initial image pixels, which has a selectively greater signal-to-noise ratio than said initial image, and which retains substantially all the phase information thereof, said generated phase vector image comprising a matrix having a size which is substantially less than said specified size;

applying a region-growing procedure to said phase vector image to remove phase errors therefrom; and expanding said phase vector image to a matrix of said specified size.

2. The method of claim 1 wherein said phase vector image generating step comprises:

constructing a first intermediate image comprising a matrix of first pixels, each of said first pixels having a signal derived by selectively averaging the signals of a corresponding group of said initial image pixels, after inverting any phase vectors thereof having a negative real component;

constructing a second intermediate image comprising a matrix of second pixels, each of said second pixels having a signal derived by selectively averaging the signals of a corresponding group of said initial image pixels, after inverting any phase vectors thereof having a negative imaginary component; and selectively processing said first and second intermediate images to form said phase-vector image.

3. The method of claim 2 wherein:

said processing step comprises comparing corresponding pixels of said first and second intermediate images, and selecting the compared pixel which is of greater amplitude as a pixel for said phase-vector image.

4. The method of claim 3 wherein said region growing procedure comprises:

selecting a random pixel of said phase-vector image as a seed pixel;

determining whether the angle between the phase-vectors of said seed pixel and of a neighboring pixel in said phase vector image is within a first or second angular range;

selecting said neighboring pixel for subsequent use as the seed pixel if said angle is within said first angular range;

inverting the phase-vector of said neighboring pixel, and then selecting it for subsequent use as the seed pixel if said angle is within said second angular range; and not using said neighboring pixel as the seed pixel if said angle is neither within said first nor second angular range.

5. The method of claim 4 wherein:

a low-pass filter is applied to said expanded phase-vector image to remove noise therefrom.

6. The method of claim 5 wherein:

said initial image matrix is selectively combined with said filtered phase-vector image to provide a phase-corrected phase-sensitive inversion recovery image.

7. The method of claim 6 wherein:

said method is directed to multi-slice imaging, and said data is acquired in accordance with distributed interleave acquisition in order to reduce the imaging time.

8. The method of claim 4 wherein:
said first angular range comprises $0°\pm\theta_0$ and said second angular range comprises $\pi\pm\theta_0$, where $\theta_0$ is an angle selected to be substantially less than 90°.

9. The method of claim 8 wherein:
$\theta_0$ is selected from a range of approximately 10° centered around 20°.

10. The method of claim 4 wherein:
said specified size of said initial image matrix is 256×256, and the size of said phase vector image matrix is 64×64.

11. The method of claim 1 wherein:
said inversion recovery sequence is provided with an inversion time selected to substantially suppress any tissue in said phase-sensitive inversion recovery image which has a T1 value lying in a specified range, said specified range including any T1 which is selectively less than or greater than a threshold value determined by said selected inversion time.

12. A phase-sensitive method of multi-slice MR imaging directed to a specified object, said method comprising the steps of:
applying an inversion-recovery MR sequence to said object to acquire a set of MR data for an initial image comprising a pixel matrix of specified size, the inversion-recovery sequence for a given slice comprising a specified inversion recovery pulse followed after a specified inversion time by a set of corresponding acquisition pulses;
generating a phase vector images from information provided by said initial image pixels, which has a selectively greater signal-to-noise ratio than said initial image, and which retains substantially all the phase information thereof, said generated phase vector image comprising a matrix having a size which is substantially less than said specified size;
applying a region-growing procedure to said phase vector image to remove phase errors therefrom; and
expanding said phase vector image to a matrix of said specified size.

13. The method of claim 12 wherein:
said method comprises generating a number of inversion recovery pulses respectively associated with slices following said given slice, during said specified inversion time.

14. The method of claim 12 wherein:
said method comprises interleaving a number of inversion recovery pulses respectively associated with slices following said given slice, with a number of acquisition pulses respectively associated with slices preceding said given slice, during said specified inversion time.

15. MR imaging apparatus comprising:
a set of MR components disposed to apply an inversion-recovery MR sequence to an object to acquire a set of MR data for an initial image comprising a pixel matrix of specified size;
a data processor receiving said MR data for generating a phase vector image, from information provided by said initial image pixels, which has a selectively greater signal-to-noise ratio than said initial image, and which retains substantially all the phase information thereof, said generated phase vector image comprising a matrix having a size which is substantially less than said specified size, said data processor disposed to apply a region-growing procedure to said phase vector image to remove phase errors therefrom; and
a pulse sequence control disposed to operate said MR components to acquire data in a distributed interleave mode.

16. The apparatus of claim set 15 wherein:
said processor is operable to construct first and second intermediate images comprising matrices of first and second pixels, respectively, each of said first pixels having a signal derived by selectively averaging signals of corresponding groups of said initial image pixels, after inverting any phase vectors thereof having a negative real component, and each of said second pixels having a signal derived by selectively averaging signals of a corresponding group of said initial image pixels, after inverting any phase vectors thereof having a negative imaginary component.

17. The method of claim 16 wherein:
said processor is operable to form said phase-vector image from said first and second intermediate images.

18. The method of claim 17 wherein:
said processor operates to compare corresponding pixels of said first and second intermediate images, and selects the compared pixel which is of greater amplitude as the pixel for said phase-vector image.

19. The apparatus of claim 18 wherein:
said apparatus includes a low-pass filter disposed to remove noise from said expanded phase-vector image.

* * * * *